United States Patent [19]

Thomas

[11] 4,413,051
[45] Nov. 1, 1983

[54] METHOD FOR PROVIDING HIGH RESOLUTION, HIGHLY DEFINED, THICK FILM PATTERNS

[75] Inventor: Lowell E. Thomas, Tewksbury, Mass.

[73] Assignee: Dynamics Research Corporation, Wilmington, Mass.

[21] Appl. No.: 260,266

[22] Filed: May 4, 1981

[51] Int. Cl.³ .................... G03C 5/00; B05D 5/12; C25D 5/02; C23F 1/02
[52] U.S. Cl. .................... 430/312; 156/634; 156/656; 156/902; 204/15; 427/96; 430/315; 430/318; 430/434
[58] Field of Search .............. 427/43.1, 96–98; 204/15; 156/630, 644, 631, 632, 633, 634, 652, 655, 668, 659.1, 661.1, 656, 901, 902; 430/312, 313, 314, 317, 318, 319, 323, 329, 434; 174/68.5

[56] References Cited

U.S. PATENT DOCUMENTS

| | | | |
|---|---|---|---|
| 3,778,900 | 12/1973 | Haining et al. | 156/630 X |
| 3,960,561 | 6/1976 | Haining et al. | 430/312 |
| 4,224,361 | 9/1980 | Romankiw | 430/314 X |
| 4,268,602 | 5/1981 | Yoshino et al. | 430/313 |
| 4,284,712 | 8/1981 | James | 430/312 |

Primary Examiner—William A. Powell
Attorney, Agent, or Firm—Weingarten, Schurgin, Gagnebin & Hayes

[57] ABSTRACT

A thick film patterned substrate is provided by laminating together a number of layers of dry photoresist without utilizing a baking step so as to provide an increased thickness resist without shrinkage, coefficient of expansion mismatch or damage to the photographic properties of the final structure. The increased thickness resist is adhered to a substrate, followed by selectively exposing the resist in a single step, developing the resist by directing a pressurized mist to the top surface of the resist and depositing material at the exposed portions of the substrate to the level established by the laminated layers. In the lamination process, the polyethylene release sheet normally used for a layer is peeled off and the layer is laminated to the substrate with the application of heat and pressure. This is followed by peeling off the polyester oxygen barrier sheet from the top of the dry resist. The next resist layer with its release sheet removed is laid on top of the first layer and laminated to the first layer by the application of heat and pressure, with the process being repeated for a number of layers until the desired thickness is achieved. The laminated dry resist and pressurized mist permits patterning of conductive films having a thick film conductivity, with resolution and line uniformity comparable to that obtainable with thin film techniques. For increased pattern definition the top polyester layer is peeled off, with an oil film being substituted to perform as an oxygen barrier and to permit intimate contact of the mask with the top surface of the laminated resist.

20 Claims, 7 Drawing Figures

METHOD FOR PROVIDING HIGH RESOLUTION, HIGHLY DEFINED, THICK FILM PATTERNS

FIELD OF INVENTION

This invention relates to the patterning of material on substrates and more particularly, to a method and apparatus for obtaining high resolution patterned thick films.

BACKGROUND OF THE INVENTION

In the semi-conductor industry, large scale integration (LSI) and very large scale integration (VLSI) based systems require non-standard printed circuit fabrication techniques to accomodate the resulting high density, high current capacity printed circuit designs. Similarly, multi-layer microwave integrated circuits, large area flat panel displays and high resolution non-impact print heads require increased resolution and increased current-carrying capability. Moreover, as the complexity of integrated circuits increases, the number of input/output terminals increases. To accommodate this increasing number of input/output terminals, while at the same time limiting device package size, integrated circuits (ICs) are mounted in small ceramic chip carriers instead of being provided as conventional dual-in-line packages. Conductor patterns extend from the IC out to the exterior portion of the chip carrier where reflow soldering connects the chip carrier to the printed circuit board. In order to accommodate a typical chip carrier with as many as 64 input/output terminals, the printed circuit board must employ interconnected multiple layers of very densely packed conductors.

For applications such as these, neither conventional etched printed circuit techniques involving the so-called "subtractive process", nor hybrid thick film techniques have adequate pattern definition, the maximum definition with these processes being 80 lines per inch (5 mil linewidth). On the other hand, hybrid thin film processes which produce the requisite pattern definition of 150–400 lines per inch (4–1 mil linewidth) often cannot accommodate requirements for overall circuit board size and, more importantly, conductor thickness.

Thus, the metalizing of a conventional printed circuit board followed by etching away of preselected portions of the metalized layer in a "subtractive process", while providing conductors of sufficient thickness, does not provide for sufficient conductor definition to meet the high resolution requirements of high density packing.

Thin film processes, employing vapor deposition while providing for high resolution conductors, cannot provide for conductors of sufficient thickness to carry currents associated with the driving of electrostatic or electromagnetic print heads, high power transistors, silicon controlled rectifiers, triacs or other high power switching devices.

Additionally, with the increased usage of flat panel gas discharge displays there is an increasing need for relatively thick conductors. These conductors are used in fabricating a conductor matrix for applying power at selected crossover points to an ionizable gas between the conductors making up the crosspoint.

The problem in obtaining the requisite conductor thickness has been due primarily to the thicknesses at which photoresist material is obtainable. Liquid photoresists, in general, cannot be built up to a thickness of more than 0.5 mils, whereas dry resists, available in sheet form, are only available to a thickness of 2 mils. Since high current carrying applications often require conductors having thicknesses on the order of 4 to 6 mils, standard liquid and dry photoresists have not been able to meet thick film requirements. In order to achieve the requisite thick film conductors, it has oftentimes been necessary to utilize multiple metalization steps with attendant problems such as registration of a mask with an underlying substrate and/or patterned metal layer. The result of multiple metalization steps has been not only a lack of pattern definition but also a lack of homogeneity in the patterned structure itself.

One method of increasing pattern thickness is through the use of multiple resist layers. As discussed in a book entitled "Photoresist Material and Processes" by W. S. DeForest, published by McGraw Hill Book Company in 1975, multiple coatings have proved to be useful in electroforming applications that require thick plating. However, a bake-and-hold cycle with about ten minutes of baking at 180° F. followed by a thirty minute cooling period is said to be necessary. Moreover, multiple exposures are said to be required with the first two resist layers being exposed prior to the lamination of a third layer. DeForest notes that after applying the third coating, the phototool must be realigned and normal exposure made. As stated by DeForest, alignment must be accurate. DeForest also states that developing will usually require two or more passes.

The utilization of multiple bake-and-hold cycles results in three highly deleterious effects. The first is resist shrinkage which results in delamination. Secondly, due to the normal mismatch of the coefficients of expansion between the resist and the substrate, the bake-and-hold steps may result in either delamination or stresses within the resist. Thirdly, all photoresists are, to some extent, heat sensitive. Multiple bake-and-hold cycles affect the photographic properties of the resist which has resulted in an inability to develop the resist. It should be noted that multiple exposures create alignment problems and multiple developing steps are costly and are apparently necessitated by the bake-and-hold cycles.

With respect to developing of dry photoresists, in general, dry photoresists are developed through the application of either a solvent or a mild alkaline solution usually applied by a coarse, high volume arrangement in which liquid streams of developer are directed over top of the exposed resist. Developing a resist in this manner, while satisfactory for most applications, does not result in a pattern having the highest degree of resolution possible. While airbrushing techniques, developed primarily at Lincoln Laboratories, have been useful in increasing the definition of certain thin film patterns, the utilization of an airbrush with thicker films tends to force the developer out of the crevices before the developer has a chance to operate.

By way of further background, as indicated in the DeForest book, dry film resists can be best categorized by the manner in which they are developed. DeForest thus categorizes dry resists in three categories, namely: Type I, the solvent-developing resists; Type II, the aqueous-developing resists; and Type III, the peel-apart resists.

Single layer resists as thick as 5 mils have been offered commercially in the past but have been removed from the market because of technical problems. As an example of the thickest type of aqueous-developing photoresist material currently available, a material designated Laminar AX dry film photopolymer is manufactured by the Dynachem Corporation, a subsidiary of Thiokol Corporation of Santa Anna, Calif. This resist is said to contain a mixture of polyfunctional acrylic or methacrylic monomers and a non-photosensitive binder resin. A mixture of unsaturated diallyl phthalate prepolymers is said to be used as a binder resin admixed with acrylic monomers such as pentaerythritol, diethylene glycol diacrylate and triethylene glycol diacrylate. The monomers are capable of forming highly interconnected three-dimensional network polymers upon exposure. Laminar AX is a blue, negative-working, dry photopolymer resist film supplied in thicknesses of 1.0, 1.5 and 2.0 mils which is sandwiched between a release sheet of 1 mil polyethylene and a cover sheet of 1 mil linear polyester. Thus, the maximum thickness that the Laminar AX dry film is available is two mils, a thickness which is insufficient to provide for the aforementioned thick film patterning of substrates.

It should be noted that U.S. Pat. No. 4,159,222 shows a method of manufacturing printed circuitry with a layer of resist having a flowable dielectric material laminated to the patterned structure. While this patent shows the use of multiple resists, the resists are not first laminated one to the other and are not patterned in one masking and exposure step.

SUMMARY OF THE INVENTION

In order to provide for relatively thick patterns on substrates in which patterned definition approaches that associated with thin film techniques, a thick film patterned substrate is provided without any baking step by laminating a number of layers of dry resist to the substrate so as to provide an increased thickness resist. This increased thickness laminated resist is then exposed in a single exposure step through the utilization of highly collimated ultraviolet (UV) light such that the exposed resist is hardened. A single developing step is then used in which an atomized developing mist under pressure is directed at the exposed resist to develop away the unhardened resist. This results in reduced undercutting and increased pattern definition. Thereafter, material is deposited at the exposed portions of the substrate, in one embodiment, by plating, with plating continuing until the deposited material reaches the level established by the laminated layers. Numbers of laminated layers may be utilized, with the lamination process effectively resulting in a homogeneous resist of the required thickness. It is a finding of this invention that the interfaces between the laminated resist layers cease to exist or in any event do not cause diffraction or diffusion of the light utilized in exposing the resist. Moreover, it is a finding of this invention that multiple layers of laminated resist may be exposed in a single step and developed in a single step, with the resulting pattern having exceptional definition.

More specifically, it has been found that the ratio of linewidth (resolution) to resist thickness becomes smaller with additional layers, so that assuming 5 layers having a total thickness of 10 mils, the resolvable linewidth is 6 mils, not 10 mils as might be expected. Thus, the resolution with multiple layers and the subject process is much better than expected.

The unusual resolution provided by the subject technique is, in part, attributable to a specialized developing method in which the developer is provided under pressure to an atomizing sprayer head which, when aimed at the top surface of the exposed resist, produces a high power mist of developer directed at the top surface of the resist to remove the resist both by chemical action and by abrasion caused by the high power atomized droplets of developer. This type of developing, while it may be used in connection with laminated resists, also improves the definition associated with any resist, be it a laminated resist, a single layer dry resist or a liquid resist. Since a high power mist results in decreased undercutting when many layers of resist are laminated together, the use of the misting step improves the performance of the laminated resist. Note however, that the laminated resist used with conventional developing also results in good pattern definition.

When utilizing Laminar AX, prior to lamination the polyethylene release sheet normally used for each layer is stripped or peeled off and the layer is laminated to the substrate with the application of heat and pressure. In one embodiment, the resist is subjected to heat from a platen after which the structure is forced together by pinch rollers. As will be described, no bake-and-hold step is used. The polyester oxygen barrier sheet is then peeled off the top of the resist. The next resist layer is laid on top of the first resist layer and heat and pressure are applied over a like period of time to effectuate the lamination, with the process being repeated for a number of layers until the desired resist thickness is achieved. Thereafter, patterning is accomplished through a single masking and exposure step followed by a single developing step.

The laminated dry resist permits patterning of conductive films having thick film conductivity, with resolutions and line uniformity comparable to that obtainable with thin film techniques. Additionally, for increased pattern definition, the top polyester layer is peeled off, with an oil film being substituted as an oxygen barrier and to permit intimate contact of the mask to the top surface of the laminated resist. When the mask is placed over the oil coated laminated resist, oil immediately under the mask is squeezed out into the aperture portions of the mask so that there is intimate contact between the mask and the top portion of the laminated resist. This prevents light leakage from off-axis rays and thus improves the definition of the resulting patterned resist.

Depending on the number of layers utilized, the masked apertures may be reduced in size so as to correct for the off-axis light through the resist. For purposes of designing the mask, it may be considered that the resist is homogeneous in nature and that there is no internal reflection or refraction at the interfaces such as may exist between the layers of resist. This aperture reduction technique increases the available line density permitted such that thick conductors may be packed very closely together.

BRIEF DESCRIPTION OF THE DRAWINGS

These and other features of the subject invention will be better understood in connection with the following detailed description taken in conjunction with the drawings, of which.

DETAILED DESCRIPTION

In order to provide a high resolution, highly defined patterned structure on a substrate, a dry resist may be laminated without a bake-and-hold step to another like dry resist, thereby to increase the resist thickness over that commercially available without the deleterious effects of baking.

Figure 1:
FIG. 1 is a cross-sectional illustration of a portion of a dry resist sheet illustrating the placement of a polyester oxygen barrier on one surface of the sheet and a polyethylene release sheet on the opposing surface.

Referring to FIG. 1, a typical dry resist is provided in the form of a sheet 10 which has a polyester oxygen barrier layer or sheet 12 on one surface. This layer functions to prevent oxygen degradation when the sheet is exposed to the ambient atmosphere or oxidizing chemicals. A polyethylene release sheet 14 is provided on the underneath side of sheet 10 and is utilized to keep the sheets separated during shipping. Typically, dry resist sheet 10 has a maximum thickness of two mils, thereby limiting the thickness of any deposited material.

In order to increase the available thickness of resist, the polyethylene release sheet for the first layer is removed and this layer is then laminated to a substrate by the application of heat and pressure. In one embodiment, a Laminar AX resist is used. Heat is applied to the resist by a 3 inch platen heated to a temperature of 235° F., with the rate of travel past the platen on the order of six inches per minute, resulting in heat being applied for no more than thirty seconds. Thereafter, the structure is passed through pinch rollers. Having provided a first layer of resist, the polyester oxygen barrier layer is peeled off or removed and a second resist layer, with the release sheet removed, is placed over the first layer. The resulting structure is then subjected to heat and pressure as described above. This process can be repeated for any number of layers until the desired thickness of resist has been achieved. It will be noted that the time-heat exposure that the resulting structures are subjected to is at least two orders of magnitude less than the bake-and-hold step described in the DeForest book. Thus, the subject process results in a laminated thick resist in which there is no shrinkage, no delamination and no alteration in the photographic properties.

Figure 2:
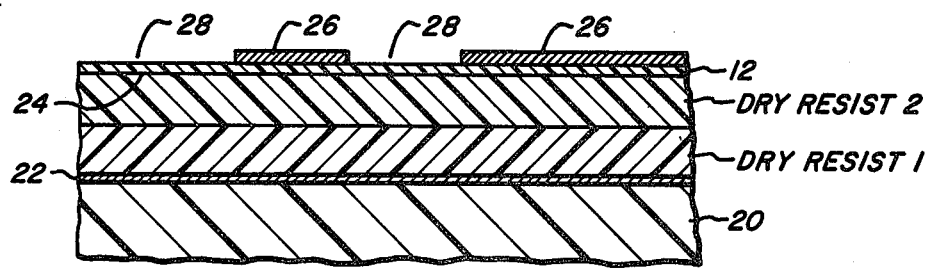
FIG. 2 is a cross-sectional illustration of the utilization of laminated resists in conjunction with a metal-coated substrate over which is positioned a mask.

For purposes of illustration, referring to FIG. 2, the sheets may be laminated to a substrate 20 which is metalized as illustrated by layer 22. The laminated resist layers are illustrated in FIG. 2 as dry resist 1 and dry resist 2, respectively. As can be seen from this figure, the polyester oxygen barrier layer 12 remains on the top surface 24 of dry resist 2. As discussed, any number of resist sheets may be provided, depending on the resist thickness required. In a single exposure step, a mask having opaque portions 26 is placed over the oxygen barrier layer and the entire top surface of the structure formed is irradiated, in one embodiment, with ultraviolet light from an incoherent source which has been highly collimated (divergence half angle less than 2 degrees) and arrives normal to the top surface. The result of the exposure of the laminated resist is the hardening of the resist in the regions immediately beneath apertures 28 of the mask. The mask and polyethylene sheet are then removed and the resist is developed in a single step. This leaves apertures beneath opaque mask portions 26.

In one embodiment, the single-step development includes providing the developer under pressure, usually between 30 and 50 psi, to an atomizing head directed at the top surface of the resist. The result is a high pressure mist directed at the resist, which because of its finely divided nature, decreases the amount of undercutting and results in increased pattern definition. A spray nozzle suitable for this purpose is a hollow cone misting nozzle manufactured by Spray Engineering Co. of Nashua, N.H. In one embodiment either the substrate or the spray nozzle is moved in a planetary fashion during development.

Figure 3:
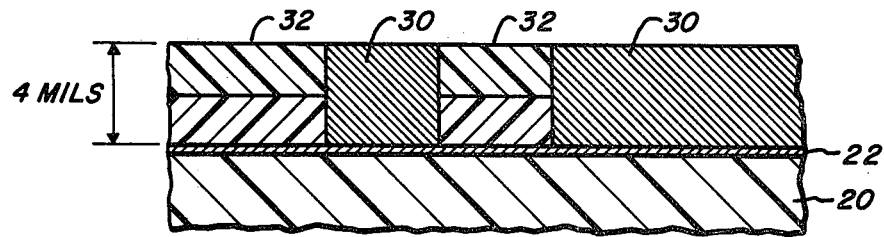
FIG. 3 is a cross-sectional illustration of the result of exposing the top surface of the structure of FIG. 2 with ultraviolet light, developing away the non-exposed resist and electroplating an electrically conductive material onto the surface of the metalized substrate within the interstices of the patterned resist.

Referring to FIG. 3, the apertures which were beneath opaque mask positions 26 are filled with material 30, which in one embodiment is an electroplated, electrically conductive material such as copper formed directly on metalization layer 22 between portions 32 of the remaining resist. For maximum conductor thickness, the material is plated up to the level of the top surface of the laminated resist. The remaining resist is then removed by subjecting it to either an alkaline stripper such as ALKASTRIP 99A or solvent stripper such as methylene chloride with additives such as Allied Chemical CB-XNT so as to remove portions 32 from between deposited portions 30.

Figure 4:
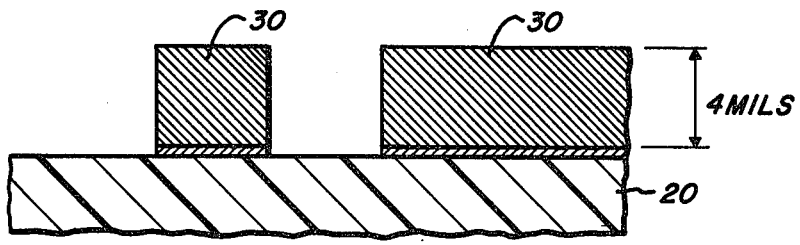
FIG. 4 is a cross-sectional illustration of the structure resulting from the removal of the hardened resist as well as etching of those portions of the surface metalization in between the electroplated conductive elements.

After the removal of portions 32, an etching step removes exposed portions of the metalization layer so as to provide the final structure illustrated in FIG. 4, with substrate 20 having conductors 30 patterned thereon to a thickness, in one embodiment, of four mils as illustrated. It will be appreciated that the four mil thickness is due to the plating of the electrically conductive material to the level established by resist portions 32 which, in this embodiment, have a combined thickness of four mils.

From the foregoing it will be appreciated that the Laminar AX resist is laminatable to itself without a bake-and-hold step. Thus, any deleterious effects to the patterning process are avoided. While the example discussed herein refers to Laminar AX, it will be appreciated that any of the laminatable dry resists commercially available are within the scope of this invention, be they solvent-developed or aqueous-developed resists.

Figure 5:
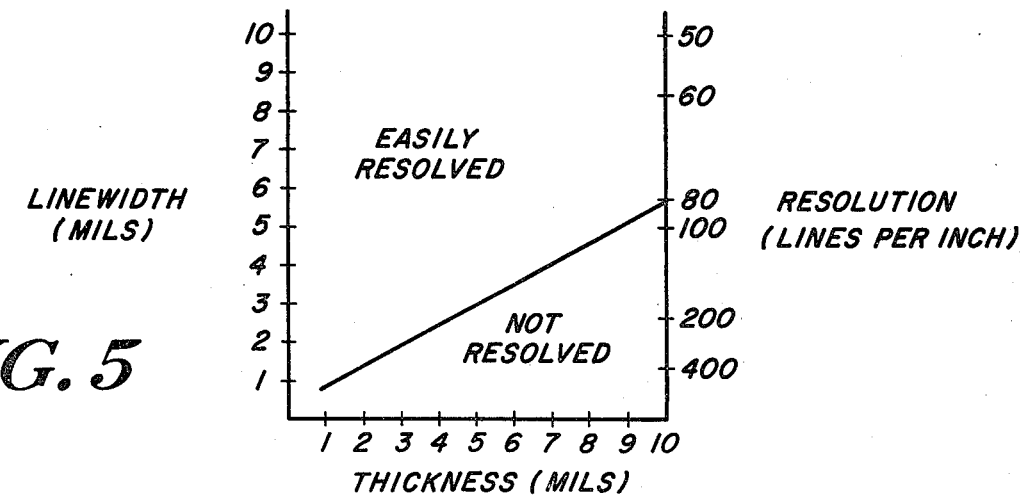
FIG. 5 is a graph relating linewidth and resolution to laminated resist thickness.

With respect to the achievable resolution with Laminar AX resists, and more particularly referring now to FIG. 5, a graph is shown of resist thickness in mils graphed against linewidth (mils) or resolution (lines per inch). The line on the graph relating these parameters indicates that within the area beneath the line resolution is not possible, whereas above the line resolution is easily achieved. From inspection it will be appreciated that for laminated resist thickness of 4 mils, a linewidth close to 2 mils can be achieved which corresponds to a resolution of approximately 200 lines per inch. For a combined laminated thickness of 10 mils, the resolvable linewidth is approximately 5.5 mils with a resolution of 80 lines per inch. What will be appreciated from this graph is that while a linear relationship is established, the slope of the line is such that as the thickness of the resist increases, the linewidth does not go up on a one-to-one basis. Rather, the achievable resolution, while decreased with increasing thickness of resist, decreases at a rate which is less than the one-to-one rate which would ordinarily be expected. Thus, very high resolution, high defined thick film patterns may be produced by the steps referred to hereinbefore. The resolution described in the graph of FIG. 5 may be even further increased by the procedures described in FIGS. 6 and 7.

Figure 6:
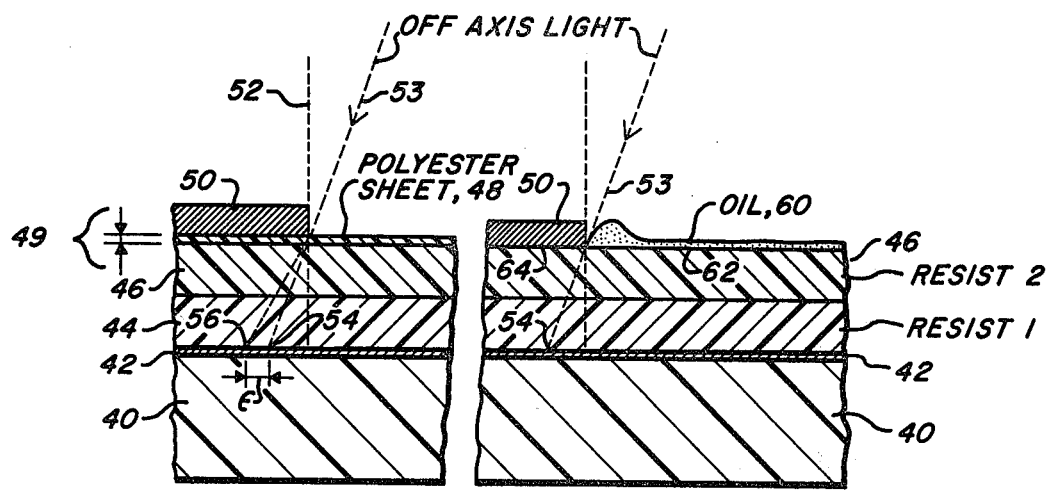
FIG. 6 is a cross-sectional and diagramatic illustration of the difference between the utilization of a polyester oxygen barrier sheet and the utilization of an oil film with respect to the degree of accuracy of the patterning of a multi-layer laminated resist.

Referring now to FIG. 6, in the patterning of multiple layers of laminated photoresists, when utilizing a polyester oxygen barrier sheet, there is a possibility of light leakage from off-axis light utilized in exposing the resist. In this figure, a substrate 40 is provided with a metalization layer 42, two layers 44 and 46 of resist, a polyester sheet oxygen barrier 48 having a thickness indicated by arrows 49 and a mask 50. Exposure light 52 arriving normal to layer 46 is not defracted at the polyester sheet/resist interface and thus very little light leakage occurs from normal rays. An off-axis ray 53, if it were not defracted when passing through the polyester sheet, would arrive at point 54 on metalizing layer 42. However, because of the finite thickness of the polyester sheet and its index of refraction vis-a-vis the index of refraction of the resist, beam 53 is defracted off-axis so that it impinges upon the metalization sheet at point 56, thereby to establish an error ϵ as indicated.

In order to minimize the light leakage associated with this error and referring to the right hand side of FIG. 6, an oil film 60 is deposited over the top surface 62 of resist 46. When mask portion 50 is pressed into intimate contact with surface 62, oil is squeezed out of the area 64 immediately under mask portion 50 such that the mask portion is in intimate contact with the top surface of the top resist layer. Thus, as illustrated, there is no deflection of light coming in along ray 53 and this prevents light leakage of the type associated with polyester sheet 48.

The types of oil which may be utilized are generically paraffin hydrocarbons, which oil is light transmissive and has a thickness of approximately 10,000 angstroms.

While the above-noted use of oil prevents light leakage due to refraction, there is a natural enlargement of the irradiated area under a mask aperture due to off-axis radiation, which enlargement is proportional to the thickness of the resist. For very thick resists, the mask patterns can be adjusted to reduce this enlargement.

Figure 7:
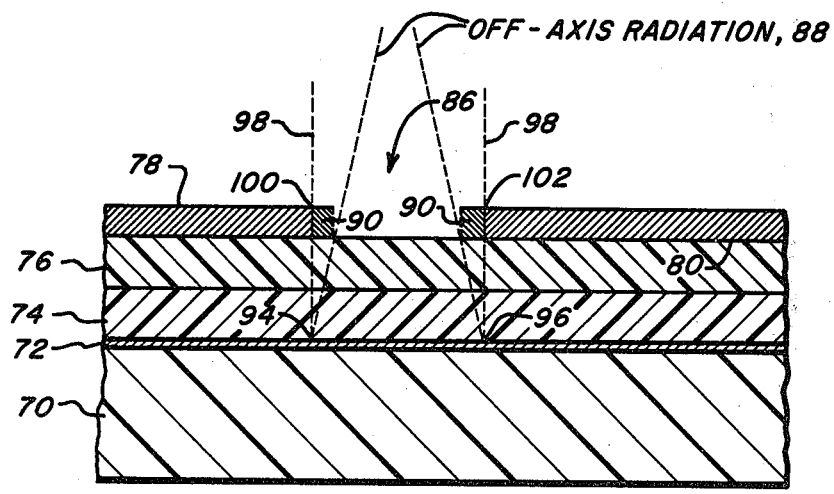
FIG. 7 is a cross-sectional and diagramatic illustration of the utilization of an undersized mask aperture to compensate for off-axis light through the resist.

Referring to FIG. 7, a substrate 70 may be provided with a metalization layer 72 on top of which is positioned a laminated resist having layers 74 and 76. A mask 78 is positioned immediately on top of the top surface 80 of layer 76. In order to eliminate any enlargement of the exposed area of the resist at the metalization layer, it is desirable to provide an aperture 86 in mask 78 which is somewhat undersized, thereby to accommodate the off-axis light 88. By decreasing aperture 86 as illustrated by shaded portions 90, off-axis rays impinge on the metalization layer at points 94 and 96, which correspond to the points at which radiation 98 normal to the top surface coming through the mask at points 100 and 102 would impinge on the metalization layer.

What is accomplished is that when utilizing multiple laminated layers of resist by narrowing the apertures of the mask, it is possible to compensate for off-axis radiation so as to provide for the desired pattern.

Having above indicated a preferred embodiment of the present invention, it will occur to those skilled in the art that modifications and alternatives can be practiced within the spirit of the invention. It is accordingly intended to define the scope of the invention only as indicated in the following claims.

I claim:

1. A method of patterning conductive films having a thick film conductivity with resolution and line uniformity comparable to that obtainable with thin film techniques, comprising the steps of:
    laminating a number of layers of dry film photo resist to a substrate without a baking step;
    selectively exposing the laminated resist in a single exposure step;
    developing the resist in a single step by applying a pressurized mist to the top surface of the exposed laminated resist, thereby to expose selected portions of the substrate; and,
    depositing material at the exposed portions of the substrate to a level established by the laminated layers.

2. The method of claim 1 wherein the laminating step includes the steps of providing a first layer of dry photo resist having a bottom release sheet and a top oxygen barrier sheet, removing the release sheet, placing the resulting resist layer over the substrate, applying just sufficient heat and pressure to laminate the first resist layer to the substrate, removing the oxygen barrier sheet, providing a second layer of dry photo resist having a bottom release sheet and a top oxygen barrier sheet, removing the release sheet on the second resist layer, placing the resulting second resist layer over the first resist layer, and applying just sufficient heat and pressure to laminate the second resist layer to the first resist layer.

3. The method of claim 2 and further including the steps of removing the oxygen barrier sheet from the second resist layer and coating the top of the second resist layer with an oil film prior to the selective exposing step, thereby to provide for increased resolution in the patterning of said laminated resists.

4. The method of claim 1 wherein the selective exposing step includes the use of highly collimated light.

5. The method of claim 4 wherein the highly collimated light has a half angle divergence of less than two degrees.

6. The method of claim 1 wherein the selective exposing step includes the steps of providing a mask on top of the laminated layers and providing undersized apertures in the mask so as to compensate for the effects of off-axis light and the thickness of the laminated layers.

7. A method of patterning conductive films comprising the steps of:
    laminating a number of layers of dry film photo resist to a substrate without a baking step;
    selectively exposing the laminated resist;
    developing the laminated resist in a single step by applying a pressurized mist to the top surface of the exposed laminated resist, thereby to expose selected portions of the substrate; and,
    depositing material at the exposed portions of the substrate.

8. The method of claim 7 wherein the laminating step includes the steps of providing a first layer of dry photo resist having a bottom release sheet and a top oxygen barrier sheet, removing the release sheet, placing the resulting resist layer over the substrate, applying heat and pressure so as to laminate the first resist layer to the substrate, removing the oxygen barrier sheet, providing a second layer of dry photo resist having a bottom release sheet and a top oxygen barrier sheet, removing the release sheet on the second resist layer, placing the resulting second resist layer over the first resist layer, and applying heat and pressure so as to laminate the second resist layer to the first resist layer.

9. The method of claim 8 and further including the steps of removing the oxygen barrier sheet from the second resist layer and coating the top of the second resist layer with an oil film prior to the selective exposing step, thereby to provide for increased resolution in the patterning of said laminated resists.

10. The method of claim 7 wherein the selective exposing step includes the use of highly collimated light.

11. The method of claim 10 wherein the highly collimated light has a half angle divergence of less than two degrees.

12. The method of claim 7 wherein the selective exposing step includes the steps of providing a mask on top of the laminated layers and providing undersized apertures in the mask so as to compensate for the effects of off-axis light and the thickness of the laminated layers.

13. A method of patterning conductive films comprising the steps of:

laminating a number of layers of dry photoresist to a substrate without a baking step, said laminating step including the steps of providing a first layer of dry photoresist having a bottom release sheet and a top oxygen barrier sheet, removing the release sheet, placing the resulting resist layer over the substrate, applying heat and pressure so as to laminate the first resist layer to the substrate, removing the oxygen barrier sheet, providing a second layer of dry photoresist having a bottom release sheet and a top oxygen barrier sheet, removing the release sheet on the second resist layer, placing the resulting second resist layer over the first resist layer and applying heat and pressure so as to laminate the second resist layer to the first resist layer;

selectively exposing the laminated resist;

developing the laminated resist; and depositing material at the exposed portions of the substrate.

14. The method of claim 13 and further including the steps of removing the oxygen barrier sheet from the second resist layer and coating the top of the second resist layer with an oil film prior to the selective exposing step, thereby to provide for increased resolution in the patterning of said laminated resists.

15. A method of patterning conductive films comprising the steps of:

laminating a number of layers of dry photoresist to a substrate without a baking step;

selectively exposing the laminated resist, said selective exposing step including the use of highly collimated light, wherein the highly collimated light has a half-angle divergence of less than 2 degrees;

developing the laminated resist; and depositing material at the exposed portions of the substrate.

16. A method of patterning conductive films comprising the steps of:

laminating a number of layers of dry photoresist to a substrate without a baking step;

selectively exposing the laminated resist, said selective exposing step including the steps of providing a mask on top of the laminated layers and providing undersized apertures in the mask so as to compensate for the effects of off-axis light and the thickness of the laminated layers;

developing the laminated resist; and depositing material at the exposed portions of the substrate.

17. A method of patterning conductive films comprising the steps of:

laminating a number of layers of dry film photoresist to a substrate without a baking step, said laminating step including the steps of providing a first layer of dry photoresist having a bottom release sheet and a top oxygen barrier sheet, removing the release sheet, placing the resulting resist layer over the substrate, applying heat and pressure so as to laminate the first resist layer to the substrate, removing the oxygen barrier sheet, providing a second layer of dry photoresist having a bottom release sheet and a top oxygen barrier sheet, removing the release sheet on the second resist layer, placing the resulting second resist layer over the first resist layer, and applying heat and pressure so as to laminate the second resist layer to the first resist layer;

selectively exposing the laminated resist in a single exposure step;

developing the laminated resist; and depositing material at the exposed portions of the substrate.

18. The method of claim 17 and further including the steps of removing the oxygen barrier sheet from the second resist layer and coating the top of the second resist layer with an oil film prior to the selective exposing step, thereby to provide for increased resolution of the patterning of the laminated resist.

19. A method of patterning conductive films comprising the steps of:

laminating a number of layers of dry film photoresist to a substrate without a baking step;

selectively exposing the laminating resist in a single exposure step, said single exposure step incuding the use of highly collimated light wherein the highly collimated light has a half-angle divergence of less than 2 degrees;

developing the laminated resist; and depositing material at the exposed portions of the substrate.

20. A method of patterning conductive films comprising the steps of:

laminating a number of layers of dry film photoresist to a substrate without a baking step;

selectively exposing the laminated resist in a single exposure step, said single exposure step including the steps of providing a mask on top of the laminated layers and providing undersized apertures in the mask so as to compensate for the effects of off-axis light and the thickness of the laminated layers;

developing the laminated resists; and depositing material at the exposed portions of the substrate.

* * * * *